(12) United States Patent
Lin et al.

(10) Patent No.: US 12,713,929 B2
(45) Date of Patent: Aug. 18, 2026

(54) FAN-OUT PACKAGING STRUCTURE AND MANUFACTURING METHOD THEREOF

(71) Applicant: JCET GROUP CO., LTD., Wuxi City (CN)

(72) Inventors: Yaojian Lin, Wuxi City (CN); Danfeng Yang, Wuxi City (CN); Shuo Liu, Wuxi City (CN); Shasha Zhou, Wuxi City (CN)

(73) Assignee: JCET GROUP CO., LTD, Wuxi City (CN)

( * ) Notice: Subject to any disclaimer, the term of this patent is extended or adjusted under 35 U.S.C. 154(b) by 638 days.

(21) Appl. No.: 18/018,266

(22) PCT Filed: May 19, 2021

(86) PCT No.: PCT/CN2021/094564

§ 371 (c)(1),
(2) Date: Jan. 26, 2023

(87) PCT Pub. No.: WO2022/037147

PCT Pub. Date: Feb. 24, 2022

(65) Prior Publication Data

US 2023/0282599 A1 Sep. 7, 2023

(30) Foreign Application Priority Data

Aug. 17, 2020 (CN) ......................... 202010827261.6

(51) Int. Cl.
*H10W 42/20* (2026.01)
*H10W 70/05* (2026.01)
(Continued)

(52) U.S. Cl.
CPC ......... *H10W 42/20* (2026.01); *H10W 70/093* (2026.01); *H10W 70/65* (2026.01);
(Continued)

(58) Field of Classification Search
CPC ...... H01L 23/552; H01L 23/66; H10W 42/20; H10W 70/65
See application file for complete search history.

(56) References Cited

U.S. PATENT DOCUMENTS

2013/0075879 A1 3/2013 Yang
2014/0293550 A1 10/2014 Mugiya et al.
(Continued)

FOREIGN PATENT DOCUMENTS

CN 102655096 A 9/2012
CN 103400825 A 11/2013
(Continued)

*Primary Examiner* — Michele Fan
(74) *Attorney, Agent, or Firm* — MUNCY, GEISSLER, OLDS & LOWE, P.C.

(57) ABSTRACT

The present invention provides a fan-out packaging structure and a manufacturing method thereof. The packaging structure includes a redistribution layer, at least one plastic packaging layer, at least one first shielding layer, at least one chip, and at least one electrical connector. The redistribution layer includes a grounding line layer, and the chip and the electrical connector are disposed on a first face of the redistribution layer and are electrically connected to the redistribution layer; the plastic packaging layer encapsulates the electrical connector and the chip; the first shielding layer at least covers a side face of the plastic packaging layer; and the electrical connector is at least partially exposed to the side face of the plastic packaging layer and electrically connected to the first shielding layer.

10 Claims, 10 Drawing Sheets

(51) Int. Cl.

| | |
|---|---|
| ***H10W 70/65*** | (2026.01) |
| ***H10W 74/01*** | (2026.01) |
| ***H10W 90/00*** | (2026.01) |
| *H10W 74/15* | (2026.01) |

(52) U.S. Cl.

CPC ....... *H10W 74/014* (2026.01); *H10W 90/701* (2026.01); *H10W 74/15* (2026.01); *H10W 90/724* (2026.01); *H10W 90/734* (2026.01)

(56) References Cited

U.S. PATENT DOCUMENTS

| | | | | |
|---|---|---|---|---|
| 2015/0035127 | A1* | 2/2015 | Yang | H01L 23/552 257/659 |
| 2018/0350753 | A1 | 12/2018 | Lee et al. | |
| 2019/0244907 | A1* | 8/2019 | Liao | H01L 23/5389 |
| 2020/0135654 | A1* | 4/2020 | Lee | H01L 23/3135 |

FOREIGN PATENT DOCUMENTS

| | | | | | |
|---|---|---|---|---|---|
| CN | 105552061 | A | | 5/2016 | |
| CN | 106960837 | A | | 7/2017 | |
| CN | 206364008 | U | | 7/2017 | |
| CN | 107660112 | A | * | 2/2018 | H05K 7/20463 |

* cited by examiner

FAN-OUT PACKAGING STRUCTURE AND MANUFACTURING METHOD THEREOF

CROSS REFERENCE TO RELATED APPLICATIONS

The present invention is a 35 U.S.C. § 371 National Phase conversion of International (PCT) Patent Application No. PCT/CN2021/094564, filed on May 19, 2021, which claims benefit of Chinese Application No. 202010827261.6, filed on Aug. 17, 2020, the disclosure of which is incorporated by reference herein. The PCT International Patent Application was filed and published in Chinese.

TECHNICAL FIELD

The present invention relates to the field of packaging technologies, and in particular, relates to a fan-out packaging structure and a manufacturing method thereof.

BACKGROUND

With the further development of integrated circuits towards high density and high integration, packaging structures of chips and electronic devices are also developing towards higher density. The fan-out wafer-level packaging and board-level packaging technology has become important packaging methods for demanding mobile/wireless networks and other electronic devices due to their advantages, such as miniaturization, low cost and high integration, and better performance and higher energy efficiency, and is one of the most promising packaging technologies at present.

At the same time, high-digitalization and high-frequency electronic components radiate a large number of electromagnetic waves of different frequencies and wavelengths into space when they are working. Serious electromagnetic radiation will interfere with the achievement of the performance of the electronic components. The demand for electromagnetic shielding devices continues to grow in the field of communication and consumer electronics, and moreover, the requirements on electromagnetic shielding are getting higher and higher.

However, compared with conventional substrates, in wafer-level or board-level fan-out packaging, in particular the high-density redistribution layer is thin. When an electromagnetic shielding film layer is deposited on side and back faces of a package, the contact area between a conductive layer and a line layer is small, leading to high resistance, which negatively affects the shielding effect.

SUMMARY

An object of the present invention is to provide a fan-out packaging structure and a manufacturing method thereof.

The present invention provides a fan-out packaging structure. The fan-out packaging structure includes a redistribution layer and at least one chip or chip-bearing package disposed on a first face of the redistribution layer, the redistribution layer including a grounding line layer;

the fan-out packaging structure further includes at least one plastic packaging layer, at least one first shielding layer and at least one electrical connector, the electrical connector being disposed on the first face of the redistribution layer, located on an outside of the chip or chip-bearing package, and electrically connected to the grounding line layer;

the plastic packaging layer is disposed at least on the first face of the redistribution layer to encapsulate the electrical connector and the chip or chip-bearing package;

the first shielding layer at least partially covers a side surface of the plastic packaging layer; and the electrical connector is at least partially exposed to the side surface of the plastic packaging layer and electrically connected to the first shielding layer, and the first shielding layer and the grounding line layer are electrically conductive to each other by means of the electrical connector.

As a further improvement of the present invention, the redistribution layer includes a patterned metal line layer and a patterned dielectric layer, and the metal line layer at least partially forms the grounding line layer.

As a further improvement of the present invention, the metal line layer has a thickness of less than 10 μm and a minimum line spacing of less than 15 μm.

As a further improvement of the present invention, a first electrical contact block is disposed on a second face opposite to the first face of the redistribution layer, and the first electrical contact block is electrically connected to the metal line layer.

As a further improvement of the present invention, the dielectric layer is made of one or a combination of an organic polymer resin, an organic polymer resin with an inorganic filler, an organic polymer resin with a glass fiber cloth and a filler sheet, and polyimide, and the metal line layer is made of one or a combination of copper, titanium, and titanium tungsten.

As a further improvement of the present invention, the electrical connector includes a body member, and the body member is made of an organic polymer resin with an inorganic filler, or an organic polymer resin with a glass fiber cloth and a filler sheet.

As a further improvement of the present invention, a first through-hole penetrating through upper and lower surfaces of the body member is disposed on a side of the body member facing a sidewall of the first shielding layer adjacent to the body member.

As a further improvement of the present invention, the first through-hole is filled with a conductive filler, a bottom of the body member is cladded with the conductive filler and is electrically connected to the grounding line layer, and side faces of the conductive filler are exposed from the plastic packaging layer and electrically connected to the first shielding layer.

As a further improvement of the present invention, the conductive filler is a conductive adhesive including silver and/or copper, or a metal solder.

As a further improvement of the present invention, a first metal layer or first metal layers is/are disposed on one or more of the upper and lower surfaces of the body member and a sidewall face of the first through-hole.

As a further improvement of the present invention, second metal layers are disposed on the upper and lower surfaces of the body member, are exposed to a side face of the plastic packaging layer, and are electrically connected to the first shielding layer.

As a further improvement of the present invention, the body member is provided with a second through-hole, which communicates the upper and lower surfaces of the body member, and the second through-hole is filled with metal or has an inner wall face covered with metal, and electrically communicates the second metal layers on the upper and lower surfaces of the body member.

As a further improvement of the present invention, the body member is provided with a second electrical contact block on the second metal layer that is located on the lower surface of the body member, and the second electrical contact block is electrically connected to the grounding line layer.

As a further improvement of the present invention, the electrical connector is made of a conductive material.

As a further improvement of the present invention, the electrical connector is a copper bump electroplated on the grounding line layer, or one or a combinational structure of a metal bump, a partial tin ball and a partial copper core ball which are bonded to the grounding line layer, or sintered and solidified metal or alloy paste.

As a further improvement of the present invention, the electrical connector is a partial metal soldering wire, one end of which is electrically connected to the grounding line layer by a solder ball, and the other end of which is exposed to the side face of the plastic packaging layer and connected to the first shielding layer.

As a further improvement of the present invention, a second shielding layer is further disposed between the first shielding layer and the plastic packaging layer, the second shielding layer being a single-layer shielding layer or a multi-layer composite shielding layer, and the second shielding layer having a different shielding coefficient from that of the first shielding layer in at least a portion of frequency range.

As a further improvement of the present invention, the second shielding layer is internally provided with a plurality of shielding-layer grooves or shielding-layer through-holes, the first shielding layer is filled in the shielding-layer grooves or the shielding-layer through-holes, or the first shielding layer is plated on inner wall faces of the shielding-layer grooves or the shielding-layer through-holes.

As a further improvement of the present invention, the electrical connector is located at each of four corners and/or on each of four edges of the redistribution layer and is distributed in a substantially symmetrical manner with respect to the center of the redistribution layer.

The present invention further provides a manufacturing method of a fan-out packaging structure. The method includes the steps of:

- providing a carrier board, fabricating a patterned metal line layer and a patterned dielectric layer on the carrier board, stacking the patterned metal line layer and the patterned dielectric layer to form a redistribution layer, and forming a grounding line layer from at least a portion of the metal line layer close to or covering or spanning at least a portion of scribe lines;
- disposing a chip, and/or a chip-bearing package, and/or a passive device on a first face of the redistribution layer and electrically connecting the chip, and/or the chip-bearing package, and/or the passive device to the metal line layer;
- disposing an electrical connector on the first face of the redistribution layer to cover or span at least a portion of the scribe lines, and electrically connecting the electrical connector to the grounding line layer;
- plastic-packaging the chip and the electrical connector to form a plastic packaging layer;
- removing the carrier board to form a first electrical contact block on a second face opposite to the first face of the redistribution layer;
- cutting a complete package along the scribe lines to form individual packaging structures; and
- forming a first shielding layer on an outside of the plastic packaging layer of each of the individual packaging structures, the first shielding layer covering at least a side face of the plastic packaging layer.

As a further improvement of the present invention, the metal line layer has a thickness of less than 10 μm and a minimum line spacing of less than 15 μm.

As a further improvement of the present invention, the dielectric layer is made of one or a combination of an organic polymer resin, an organic polymer resin with an inorganic filler, an organic polymer resin with a glass fiber cloth and a filler sheet, and polyimide, and the metal line layer is made of one or a combination of copper, titanium, and titanium tungsten.

As a further improvement of the present invention, disposing the electrical connector on the first face of the redistribution layer specifically includes:

fabricating, in a body member, a first through-hole penetrating through upper and lower surfaces of the body member, filling the first through-hole with a conductive filler and coating a bottom face of the body member with the conductive filler to electrically connect the body member to the grounding line layer by means of the conductive filler, the first through-hole covering or spanning at least a portion of scribe lines.

As a further improvement of the present invention, the body member is made of an organic polymer resin with an inorganic filler, or an organic polymer resin with a glass fiber cloth and a filler sheet, and the conductive filler is a conductive adhesive including silver and/or copper, or a metal solder.

As a further improvement of the present invention, a metal layer or metal layers is/are formed on one or more of the upper and lower surfaces of the body member and a sidewall face of the first through-hole.

As a further improvement of the present invention, disposing the electrical connector on the first face of the redistribution layer specifically includes:

- fabricating, in a body member, a second through-hole penetrating through upper and lower surfaces of the body member, plating an interior of the second through-hole with a metal, and disposing second metal layers on the upper and lower surfaces of the body member, the second metal layers covering or spanning at least a portion of scribe lines; and
- fabricating a second electrical contact block on the second metal layer on the lower surface of the body member to bond tag electrical connector to the grounding line layer by means of the second electrical contact block.

As a further improvement of the present invention, disposing the electrical connector on the first face of the redistribution layer specifically includes:

- bonding and electrically connecting one or a combination of a metal bump, a tin ball, and a copper core ball to the grounding line layer to cover or span at least a portion of scribe lines; or electroplating the grounding line layer with a copper bump, which covers or spans at least a portion of scribe lines; or disposing sintered and solidified metal or alloy paste on the grounding line layer to cover or span at least a portion of the scribe lines.

As a further improvement of the present invention, disposing the electrical connector on the first face of the redistribution layer specifically includes: bonding and connecting the grounding line layers on both sides of the scribe lines by means of metal bonding wires.

As a further improvement of the present invention, before fabricating the first shielding layer, the method further includes the steps of:

fabricating one or more shielding layers on the plastic packaging layer to form a second shielding layer;

fabricating a plurality of shielding-layer grooves or shielding-layer through-holes in the second shielding layer; and filling or plating the shielding-layer grooves or shielding-layer through-holes with a material of the first shielding layer.

As a further improvement of the present invention, the second shielding layer has a different shielding coefficient from that of the first shielding layer in at least a portion of frequency range.

The present invention has the following beneficial effects: the first shielding layer is connected to the grounding line layer by means of the electrical connector, such that the electrical connector may have relatively large-area surface contact with the first shielding layer and the grounding line layer, respectively, thereby reducing the resistance among the grounding line layer, the first shielding layer and the grounding line layer to improve the shielding effect of the first shielding layer. Thus, higher resistance occurring due to direct connection of the first shielding layer to the thin metal line layer on the side face is avoided. Meanwhile, the electrical connector in the present invention is made of a conventional low-cost material, has a simple manufacturing process, and is easy to realize and thus applicable to large-scale industrial manufacturing procedures. In addition, electromagnetic waves in different frequency ranges can be effectively shielded by combining the first shielding layer with the second shielding layer.

DETAILED DESCRIPTION

Figure 1:
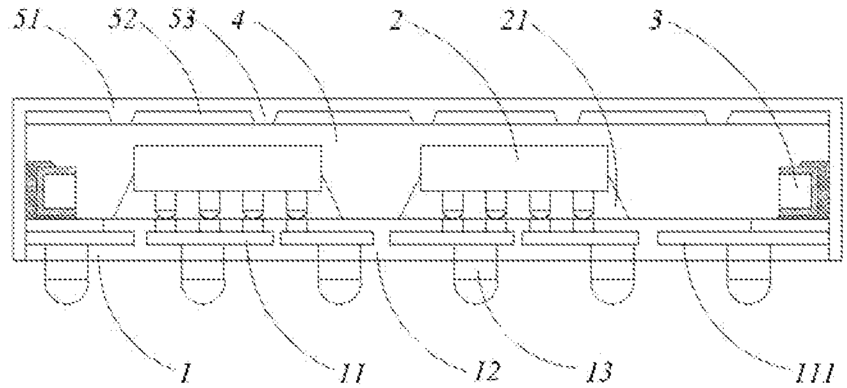
FIG. 1 is a schematic diagram of a fan-out packaging structure according to Embodiment 1 of the present invention.

In order to make the objects, technical solutions, and advantages of the present application clearer, the technical solutions of the present application will be clearly and completely described below in conjunction with the specific embodiments of the present application and the corresponding drawings. Obviously, the described embodiments are only some of the embodiments of the present application, rather than all of the embodiments. Based on the embodiments in the present application, all other embodiments obtained by those of ordinary skill in the art without creative work shall fall within the protection scope of the present application.

The following describes the embodiments of the present invention in detail. Examples of the embodiments are shown in the accompanying drawings, in which the same or similar reference numerals indicate the same or similar elements or the elements with the same or similar functions throughout the description. The following embodiments described with reference to the accompanying drawings are exemplary only for the purpose of explaining the present invention, and should not be understood as limiting the present invention.

For the convenience of description, the terms, such as "upper", "lower", "rear" and "front", representing the relative positions in space are used herein to describe the relationship of one unit or feature shown in the drawings relative to another unit or feature. The terms describing the relative positions in space may include different orientations of the device in use or in operation other than the orientations shown in the drawings. For example, if a device in the drawings is turned over, the unit described as being "below" or "above" other units or features will be positioned "above" or "below" the other units or features. Therefore, the exemplary term "below" can encompass the spatial orientations of both below and above.

As shown in FIG. 1, the present invention provides a fan-out packaging structure. The fan-out packaging structure includes a redistribution layer 1, at least one chip 2, a plastic packaging layer 4, a first shielding layer 51, and at least one electrical connector 3. The chip 2 may be a chip-bearing package. The redistribution layer 1 includes patterned metal line layers 11 and patterned dielectric layers 12; the metal line layers 11 and the dielectric layers 12 are alternately stacked to form the redistribution layer 1; and the metal line layer 11 at least partially forms a grounding line layer 111. Each of the metal line layer 11 and the dielectric layer 12 may be a single-layer or a multi-layer.

Specifically, the metal line layer 11 has a thickness of less than 10 μm and a minimum line spacing of less than 15 μm, and with such sizes, the redistribution layer 1 can meet the wiring requirements of high density and high integration.

Further, a plurality of first electrical contact blocks 13 are disposed on a second face opposite to the first face of the redistribution layer 1, and the first electrical contact blocks 13 are electrically connected to the metal line layers 11 respectively.

The first electrical contact block 13 may be a solder ball with the metal layer 33 under the ball, or a composite structure with a tin cap, such as a copper-nickel-tin-silver structure, as long as it is an interconnection structure capable of forming an electrical connection with the outside.

The dielectric layer 12 is made of one or a combination of an organic polymer resin, an organic polymer resin with an inorganic filler, a polymer resin with a glass fiber cloth and an organic filler sheet, and polyimide, and the metal line layer 11 is made of one or a combination of copper, titanium, and titanium tungsten.

The chip 2 is disposed on the first face of the redistribution layer 1 and electrically connected to the metal line layer 11. When there are at least two chips 2, the metal line layer 11 provides electrical interconnection between the plurality of chips 2.

In some other embodiments of the present invention, other passive components such as capacitors and resistors, or other functional components such as heat sinks and reinforcing ribs may also be disposed on the redistribution layer 1.

In some embodiments of the present invention, a bottom filler 21 is also provided among the chip 2, the chip-bearing package, the passive components, the functional components, and the redistribution layer.

The metal line layer 11 includes a portion of the grounding line layer 111, which is disposed on an outside of the metal line layer 11 that is connected to the chip 2 or the passive components.

The electrical connector 3 is disposed on the first face of the redistribution layer 1, located on an outside of the chip 2, and electrically connected to the grounding line layer 111.

The plastic packaging layer 4 is disposed on the first face of the redistribution layer 1 to encapsulate the electrical connector 3 and the chip 2. The plastic packaging layer 4 is formed by filling with a plastic packaging material, which may be an epoxy resin, polyimide, a dry film, and other polymer composites with fillers. The plastic packaging layer 4 provides a physical support for the packaging structure, and protects the chip 2, the electrical connector 3, the passive components, etc.

Further, in this embodiment, the plastic packaging layer 4 covers the side surface and upper surface of the chip 2, and is filled in a region between the chip 2 and the redistribution layer 1.

Furthermore, the plastic packaging layer 4 clads most of the surface of the electrical connector 3; at least a portion of the electrical connector 3 is exposed to the side face of the plastic packaging layer 4, and is conductive; and a conductive path is formed in the electrical connector 3 from the end of the electrical connector 3 connected to the grounding line layer 111 to the end of the electrical connector 3 exposed to the plastic packaging layer 4.

The first shielding layer 51 at least partially covers a side surface of the plastic packaging layer 4.

Further, in this embodiment, the first shielding layer 51 covers the side surface and the upper surface of the plastic packaging layer 4, and substantially covers all the surfaces of the plastic packaging layer 4 by forming multi-face cladding on the packaging structure, which protects the chip 2 or other passive components packaged in the packaging structure against electromagnetic interference, and the fully covered structure can further strengthen the shielding effect of the first shielding layer 51.

The first shielding layer 51 may be made of, for example, sputtered sandwiched metal film materials of copper, stainless steel and titanium, such as stainless steel/copper/stainless steel and titanium/copper/titanium, or a conductive composite such as a conductive resin containing high-density metal fillers such as silver/copper, or a combination of at least two of the aforementioned materials as long as the material may play the role of shielding or absorbing electromagnetic waves.

In some other embodiments of the present invention, a second shielding layer 52 is further disposed between the first shielding layer 51 and the plastic packaging layer 4; the second shielding layer 52 is a single-layer shielding layer or a multi-layer composite shielding layer; and the second shielding layer 52 has a different shielding coefficient from that of the first shielding layer 51 in at least a portion of frequency range, such that the first and second shielding layers 51 and 52 can cooperate to shield electromagnetic waves in a wider frequency range.

Further, the second shielding layer 52 is internally provided with a plurality of shielding-layer grooves or shielding-layer through-holes 53; the first shielding layer 51 is filled in the shielding-layer grooves or the shielding-layer through-holes 53; or the first shielding layer 51 is plated on inner wall faces of the shielding-layer grooves or the shielding-layer through-holes 53. Therefore, the electric contact area between the first shielding layer 51 and the second shielding layer 52 can be increased, thereby improving the conductivity between the first shielding layer 51 and the second shielding layer 52, and meanwhile, the structure of the groove or hole will not cause obvious damage to the shielding performance of the second shielding layer.

The electrical connector 3 is electrically connected, at its end exposed to the plastic packaging layer 4, to the first shielding layer 51, and the first shielding layer 51 and the grounding line layer 111 are electrically conducive to each other by means of the electrical connector 3, such that the first shielding layer 51 is electrically connected to an external low-impedance grounding point by means of the electrical connector 3 and the grounding line layer 111.

Further, an upper end surface of the electrical connector 3 is lower than an upper end surface of the chip 2.

Preferably, the distance between the upper end face of the electrical connector 3 and the upper end face of the chip 2 is greater than or equal to 15 μm.

Here, since the redistribution layer 1 has a small thickness, the metal line layer 11 has a thickness of less than 10 μm, and the first shielding layer 51 is connected to the grounding line layer 111 by means of the electrical connector 3, the electrical connector 3 may have relatively large-area surface contact with the first shielding layer 51 and the grounding line layer 111, respectively, thereby reducing the resistance among the electrical connector 3, the first shielding layer 51 and the grounding line layer 111 to improve the shielding effect of the first shielding layer 51. Thus, higher resistance occurring due to direct connection of the first shielding layer 51 to the thin metal line layer 11 on the side face is avoided.

Figure 2:
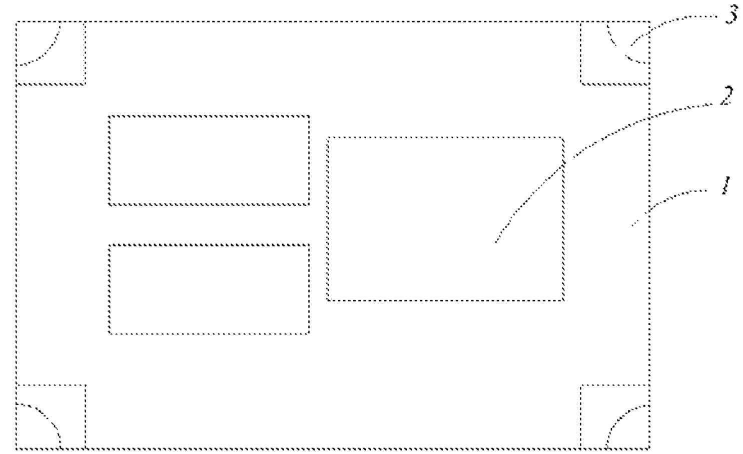
FIG. 2 to FIG. 4 are schematic diagrams of electrical connectors at different distribution positions according to the present invention.
Figure 3:
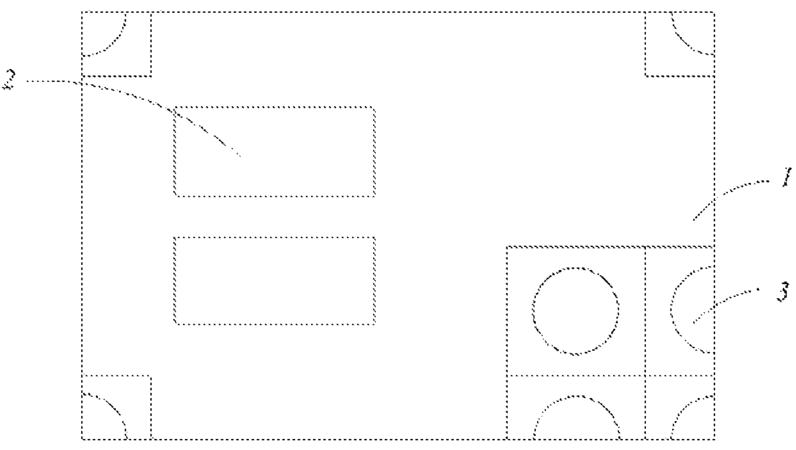
Figure 4:
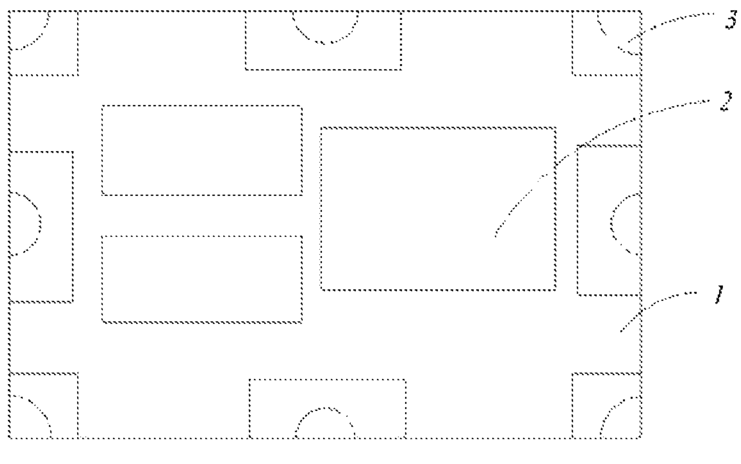

As shown in FIGS. 2 to 4, in some embodiments of the present invention, the electrical connectors 3 are located on many of the four corners and/or four edges of the redistribution layer 1, and are substantially symmetrically distributed with respect to the center of the redistribution layer 1. Since the material of the electrical connector 3 has a large thermal expansion coefficient, warpage can be suppressed to a certain extent. In addition, the distribution position and size of the electrical connectors 3 may be adjusted according to the dimensional structure and distribution of the components on the redistribution layer 1.

In the present invention, the electrical connector 3 is implemented in a variety of modes, which will be specifically described below in combination with a plurality of embodiments.

Figure 5:
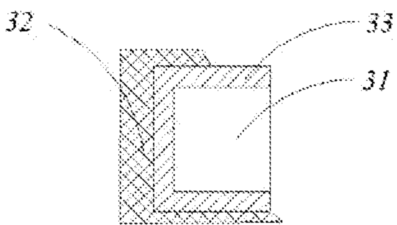
FIG. 5 is a schematic enlarged view of the electrical connector in FIG. 1.
Figure 6:
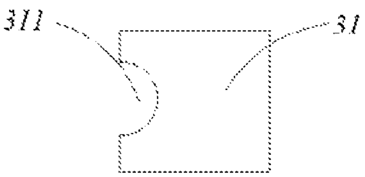
FIG. 6 is a top view of a body member according to Embodiment 1 of the present invention.

As shown in FIGS. 5 to 6, in Embodiment 1, the electrical connector 3 includes a body member 31, which is provided, on its side facing a sidewall of the first shielding layer 51 adjacent to the body member 31, with a through-hole 311 penetrating through upper and lower surfaces of the body member 31.

The body member 31 is made of an organic polymer resin with an inorganic filler, or an organic polymer resin with a glass fiber cloth and a filler, a synthetic resin and other polymer materials, or low-cost basic materials with certain structural strength, such as silicon and ceramics, which are used to provide structural support for the electrical connector 3.

The first through-hole 311 is filled with a conductive filler 32, the side of which is exposed and electrically connected to the first shielding layer 51.

The bottom of the body member 31 is cladded with the conductive filler 32, and is electrically connected to the grounding line layer 111 by means of the conductive filler 32, such that the first shielding layer 51 is electrically connected to the grounding line layer 111 by means of the conductive filler 32.

The conductive filler 32 is a conductive filler, such as a conductive adhesive of silver and/or copper, or a metal solder.

One or more of the upper and lower surfaces of the body member 31 and the sidewall face of the first through-hole 311 are optionally provided with a first metal layer(s) 33, which may be a single layer formed from copper, silver, tin, nickel and other suitable conductive materials, or a composite layer formed from a variety of materials.

Further, in Embodiment 1, the upper and lower surfaces of the body member 31 and the sidewall face of the through-hole 311 each are provided with the metal layer 33. The conductive filler 32 is fully filled in the first through-hole 311 and partially covers the first metal layer 33 covered on the upper surface of the body member 31. The provision of the metal layer 33 can strengthen the electrical conductivity of the electrical connector 3.

Figure 7:
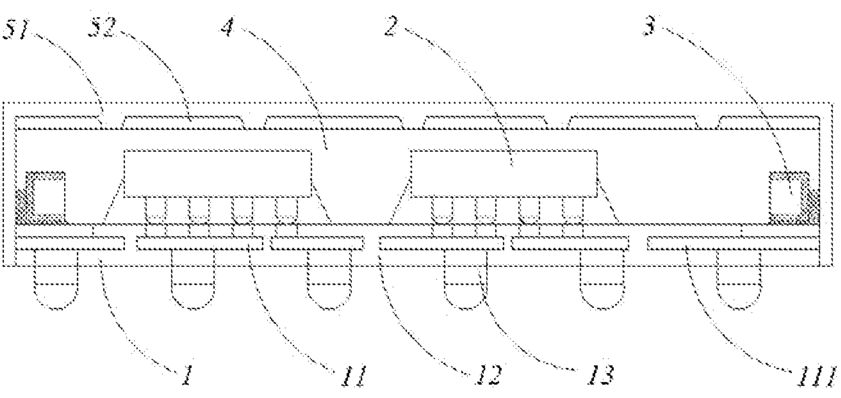
FIG. 7, FIG. 9, and FIG. 11 are schematic diagrams of the fan-out packaging structure in Embodiment 1 of the present invention according to another embodiment, respectively.
Figure 8:
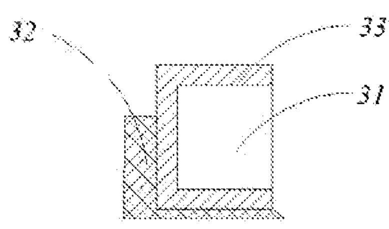
FIG. 8, FIG. 10, and FIG. 12 are schematic enlarged views of the electrical connectors in FIG. 7, FIG. 9, and FIG. 11, respectively.

As shown in FIGS. 7 and 8, in some other implementation modes of Embodiment 1, the conductive filler 32 may also be partially filled in the first through-hole 311 as long as the side face of the conductive filler 32 is connected to the first shielding layer 51 and the bottom face of the conductive filler 32 is connected to the grounding line layer 111.

Figure 9:
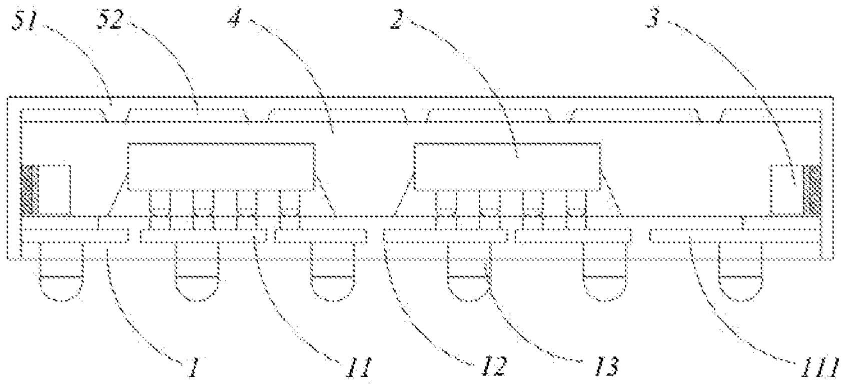
Figure 10:
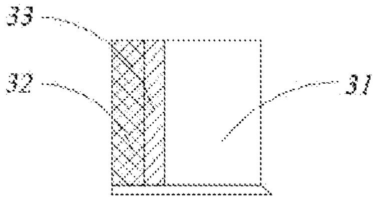

As shown in FIGS. 9 and 10, in some other implementation modes of Embodiment 1, the sidewall of the first through-hole 311 is plated with the first metal layer 33, and the conductive filler 32 is completely filled in the first through-hole 311.

Figure 11:
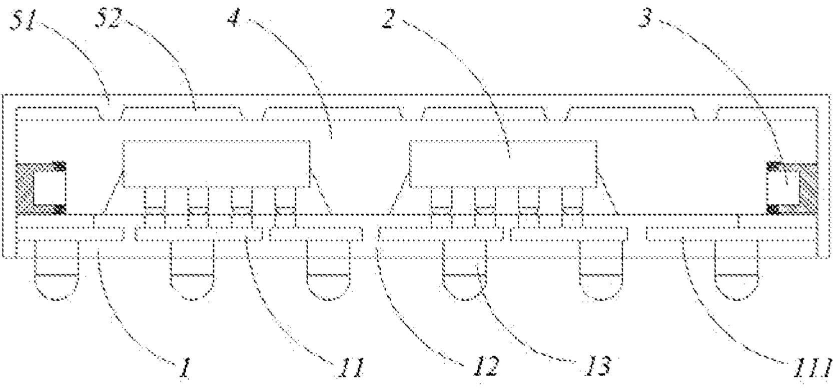
Figure 12:
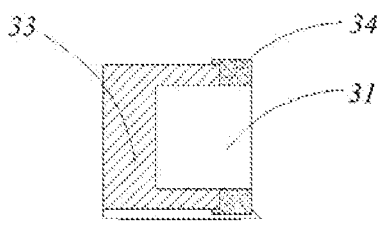

As shown in FIGS. 11 and 12, in some other implementation modes of Embodiment 1, the inner wall face of the first through-hole 311 and part of the upper and lower surfaces of the electrical connector 3 adjacent to the first through-hole 311 are both plated with the metal layers 33. A surface of the body member 31 covered with no first metal layer 33 and a surface of a portion of the first metal layer 33 are provided with green oil material layers 34 to protect the electrical connector 3. The electrical connector 3 is connected to the first shielding layer 51 by means of the metal layer 33, and the bottom face of the body member 31 is connected to the grounding line layer 111 by means of the conductive adhesive.

Figure 13:
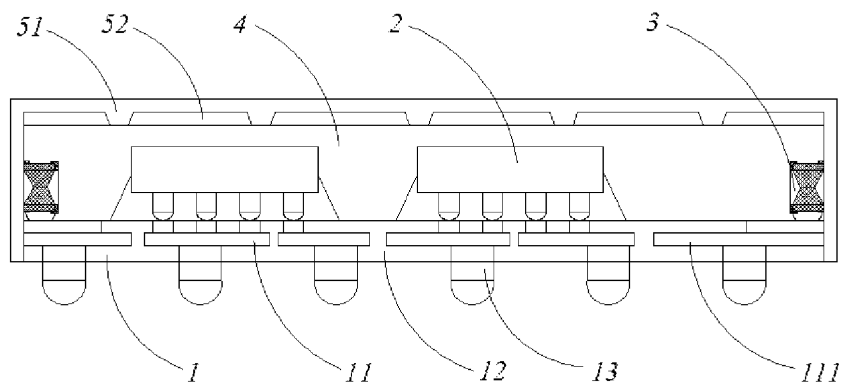
FIG. 13 is a schematic diagram of a fan-out packaging structure according to Embodiment 2 of the present invention.
Figure 14:
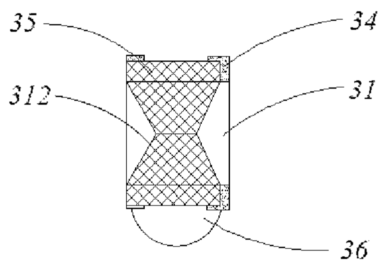
FIG. 14 is a schematic enlarged view of the electrical connector in FIG. 13.

As shown in FIGS. 13 and 14, in the Embodiment 2, the upper and lower surfaces of the body member 31 are provided with second metal layers 35, which are exposed to the side face of the plastic packaging layer 4 and electrically connected to the first shielding layer 51.

The body member is provided with a second through-hole 312, which communicates the upper and lower surfaces of the body member 31, and the second through-hole 312 is filled with metal or has an inner wall face covered with metal, and electrically communicates the second metal layers 35 on the upper and lower surfaces of the body member 31.

The body member 31 is provided with a second electrical contact block 36 on the second metal layer 35 that is located on the lower surface of the body member 31, and the second electrical contact block 36 is electrically connected to the grounding line layer 111.

Portions, covered with no second metal layer 35, of the upper and lower surfaces of the body member 31, and the surface of a portion of the second metal layer 35 are provided with green oil material layers 34 to protect the electrical connector 3.

Figure 15:
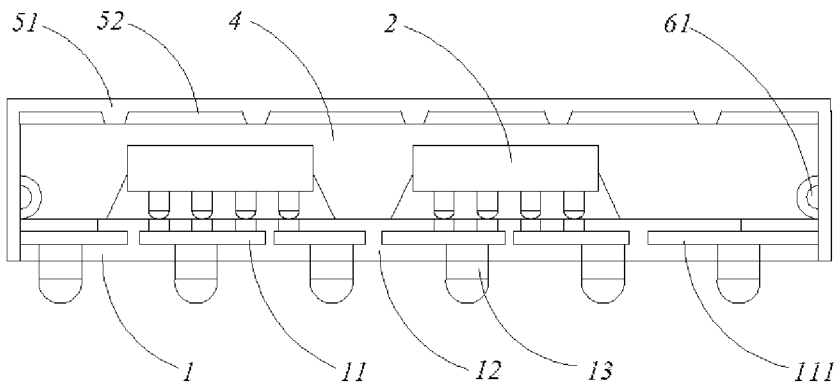
FIG. 15, FIG. 16, FIG. 17, and FIG. 18 are schematic diagrams of the fan-out packaging structures according to Embodiment 3, Embodiment 4, Embodiment 5, and Embodiment 6 of the present invention, respectively.

As shown in FIG. 15, in Embodiment 3, a body material of the electrical connector 3 is a conductive material.

Specifically, the electrical connector 3 is one or a combinational structure of a metal bump, a partial tin ball and a partial copper core ball 61 which are bonded to the grounding line layer.

It can be understood that, since a complete tin ball or a complete copper core ball 61 is soldered on the grounding line layer 111 and covers the scribe line during the manufacturing process, the electrical connector 3 disposed in an individual packaging structure after a cutting process is roughly half of the tin ball or half of the copper core ball 61.

A cutting face of one or a combinational structure of the metal bump, the partial tin ball, and the partial copper core ball 61 is connected to the first shielding layer 51, and the bottom face thereof is connected to the grounding line layer 111 via soldering.

Figure 16:
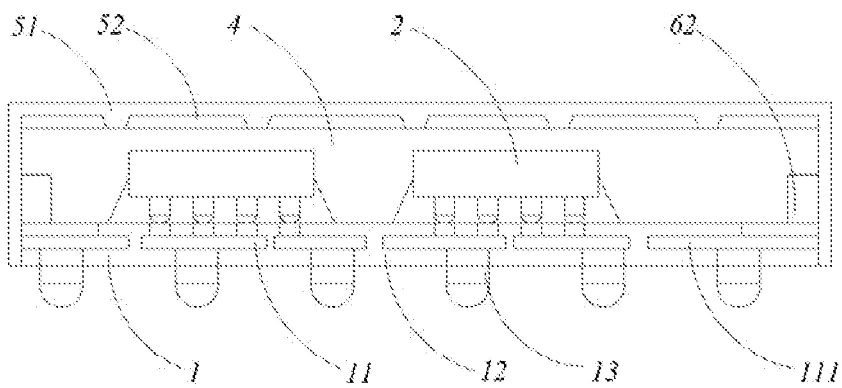

As shown in FIG. 16, in Embodiment 4, the body material of the electrical connector 3 is a conductive material.

Specifically, the electrical connector 3 is a copper bump 62 electroplated on the grounding line layer, and the copper bump 62 may be cylindrical, square, rectangular, elliptical or runway-shaped.

Figure 17:
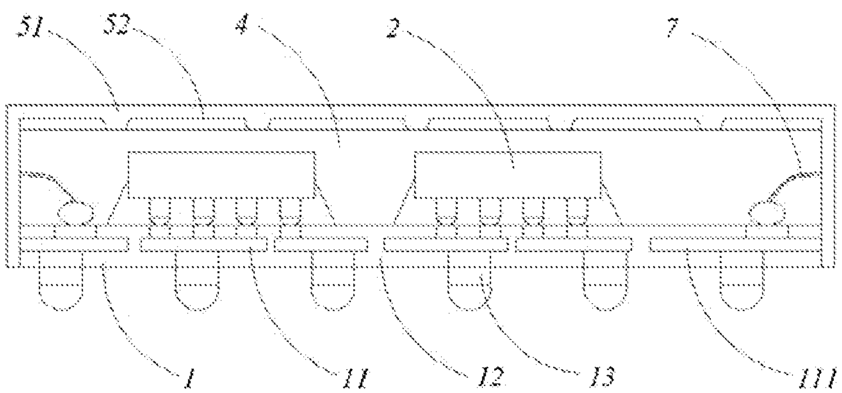

As shown in FIG. 17, in Embodiment 5, the body material of the electrical connector 3 is a conductive material.

Specifically, the electrical connector 3 is a partial metal soldering wire 7, one end of which is electrically connected to the grounding line layer 111, and the other end of which is exposed to the side face of the plastic packaging layer 4 and connected to the first shielding layer 51.

It can be understood that, since both ends of the metal soldering wire 7 are bonded to the grounding line layers 111 on both sides of the scribe line respectively during the manufacturing process, the electrical connector 3 disposed in an individual packaging structure after the cutting process roughly adopts the structure of a half of the metal soldering wire 7 that is cut from the middle, and the cutting face of the metal soldering wire 7 is connected to the first shielding layer 51.

Figure 18:
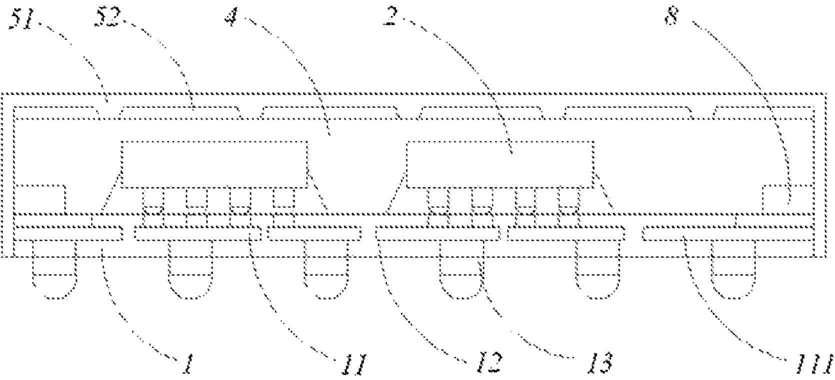

As shown in FIG. 18, in Embodiment 6, the electrical connector 3 is solidified metal paste 8. The solidified metal paste 8 may be, for example, sintered silver or sintered copper or silver copper alloy.

Figure 19:
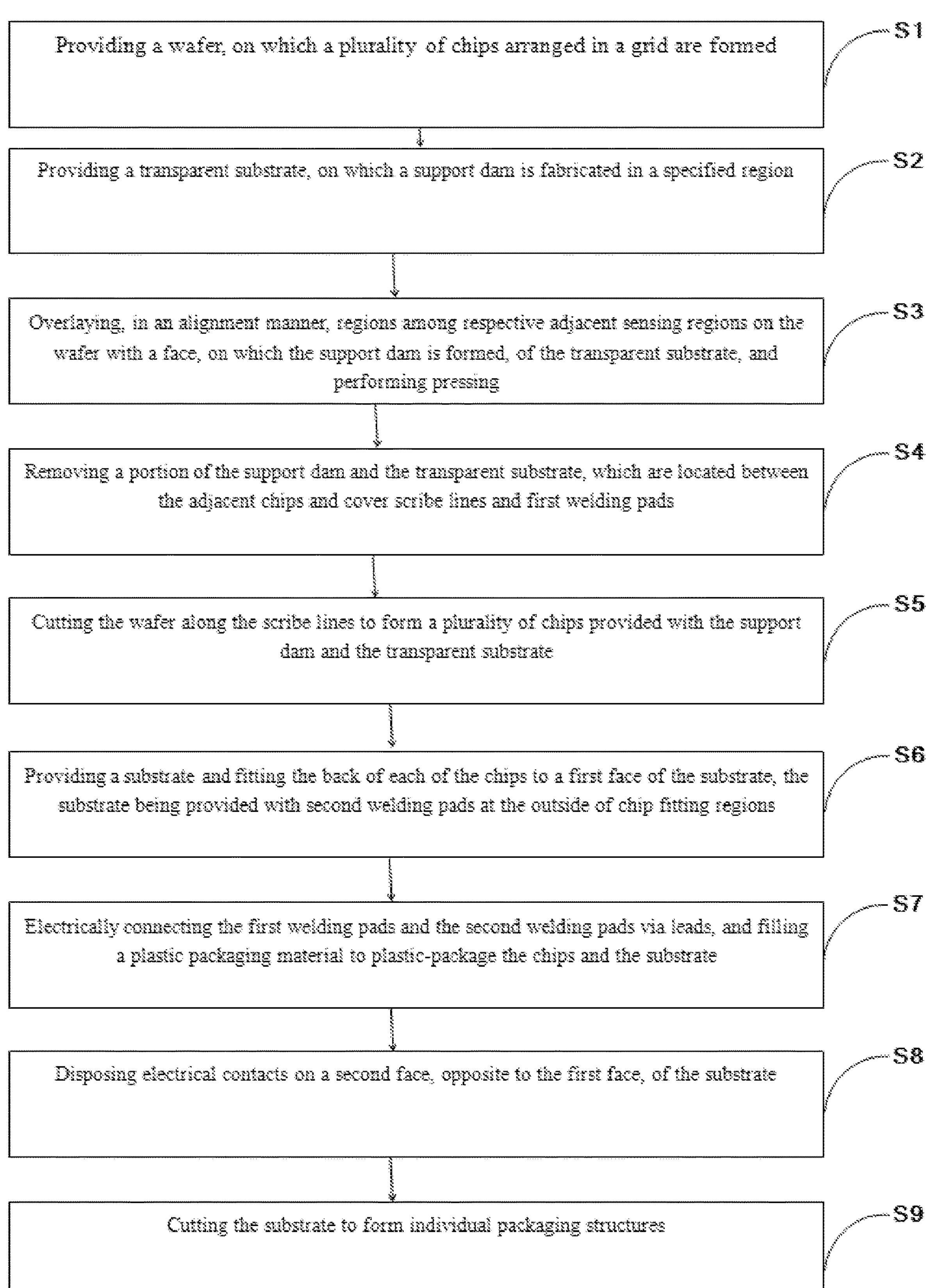
FIG. 19 is a schematic flowchart of a manufacturing method of a fan-out packaging structure according to the present invention.

As shown in FIG. 19, the present invention further provides a manufacturing method of a fan-out packaging structure. The method includes the following steps.

Figure 20:
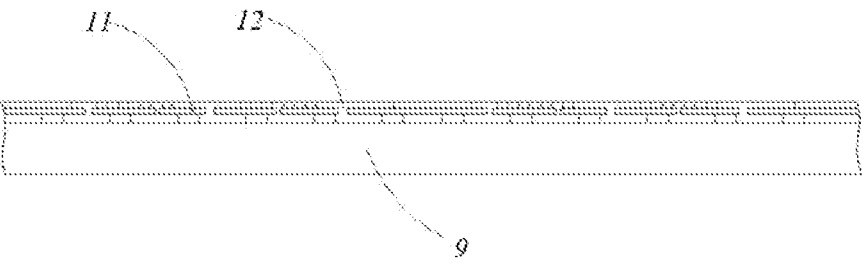
FIG. 20 to FIG. 27 are schematic diagrams of various steps of a manufacturing method of a fan-out packaging structure according to the present invention.

In S1, as shown in FIG. 20, a carrier board 9 is provided; a patterned metal line layer 11 and a patterned dielectric layer 12 are fabricated on the carrier board 9, and stacked to form a redistribution layer 1; and a grounding line layer 111 is formed from at least a portion of the metal line layer 11 close to scribe lines.

The carrier board 9 is such as glass, silicon, composite polymer, and other low-cost sacrificial substrates with certain rigidity to provide structural support.

Specifically, the metal line layer 11 has a thickness of less than 10 μm and a minimum line spacing of less than 15 μm.

The dielectric layer 12 is made of one or a combination of a photosensitive or non-photosensitive organic polymer resin, an organic polymer resin with an inorganic filler, an organic polymer resin with a glass fiber cloth and a filler sheet, and polyimide, and the metal line layer 11 is made of one or a combination of copper, titanium, and titanium tungsten.

Figure 21:
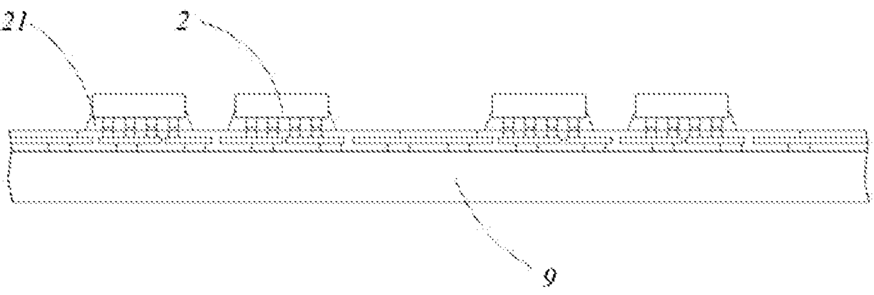

In S2, as shown in FIG. 21, a chip 2 is disposed on a first face of the redistribution layer 1 and is electrically connected to the metal line layer 11.

In some other embodiments of the present invention, other passive components such as capacitors and resistors, or other functional components such as heat sinks and reinforcing ribs may also be disposed on the redistribution layer 1.

In some other embodiments of the present invention, a bottom filler may also be filled between the chip 2 or other components and the redistribution layer 1 to provide protection and connection reinforcement.

Figure 22:
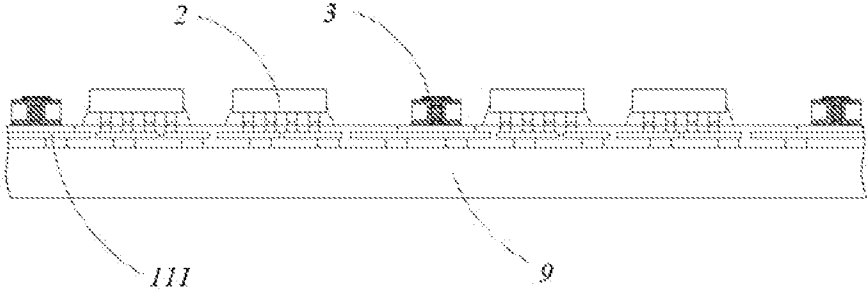

In S3, as shown in FIG. 22, an electrical connector 3 is disposed on the first face of the redistribution layer 1, covers or spans at least a portion of the scribe lines, and is electrically connected to the grounding line layer 111.

In some embodiments of the present invention, the electrical connectors 3 are located on many of four corners and/or four edges of the redistribution layer 1 and are distributed in a substantially symmetrical manner with respect to the center of the redistribution layer 1. In addition, the distribution position and size of the electrical connectors 3 can be adjusted according to the dimensional structure and distribution of the components on the redistribution layer 1.

Figure 23:
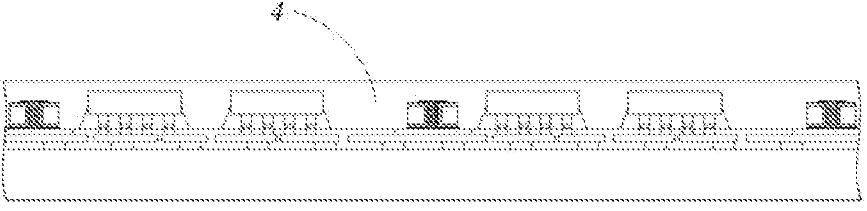

In S4, as shown in FIG. 23, the chip 2 and the electrical connector 3 are plastic-packaged to form the plastic packaging layer 4.

Polymer composites with fillers, such as an organic polymer resin with an inorganic filler, or an organic polymer resin with a glass fabric and a filler, or an epoxy resin, polyimide (PI), and a dry film, are deposited on the first face of the redistribution layer 1 as plastic packaging materials to encapsulate the electrical connector 3 and the chip 2.

Figure 24:
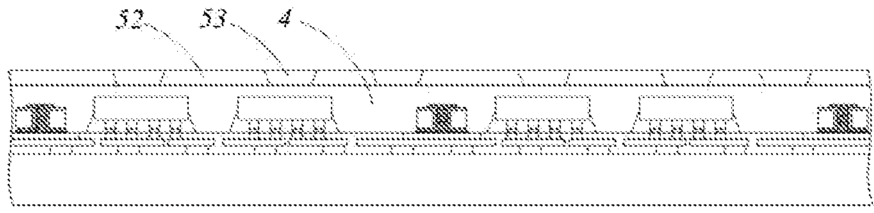

In some embodiments of the present invention, as shown in FIG. 24, after the plastic packaging layer 4 is formed, the method further includes step S41:

one or more shielding layers are fabricated on the plastic packaging layer 4 to form a second shielding layer 52, on which a plurality of shielding-layer grooves or shielding-layer through-holes 53 are fabricated.

Step S41 may also be performed after step S5 as long as it is performed before the first shielding layer 51 is fabricated.

Figure 25:
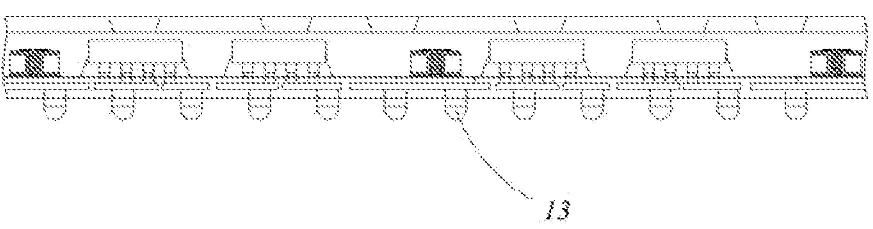

In S5, as shown in FIG. 25, the carrier board 9 is removed, and a first electrical contact block 13 is formed on a second face opposite to the first face of the redistribution layer 1.

The carrier board 9 is stripped off by laser debonding separation, mechanical stripping, chemical etching, mechanical grinding and other methods, so that an active interface of the metal line layer 11 on the second face of the redistribution layer 1 is exposed; the required cleaning is performed; and for example, a solder ball with a metal layer 33 under the ball is implanted as the first electrical contact block 13, or a composite metal structure with a tin cap (such as a copper bump) is formed by photoetching and electroplating, as the first electrical contact block 13. Optionally, after separation and cleaning, a second redistribution stack layer is formed between the first electrical contact block 13 and the previous redistribution layer 1.

Figure 26:
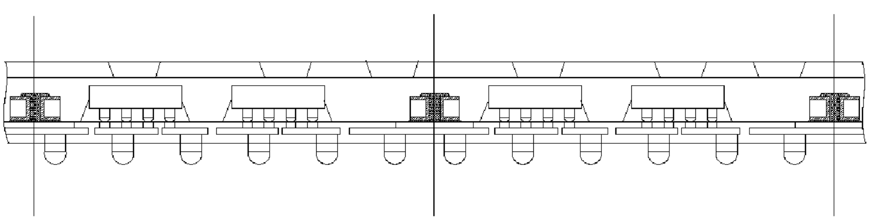

In S6, as shown in FIG. 26, a complete package is diced along the scribe lines to form individual packaging structures.

The complete packaging structure is divided into individual packaging structures along the scribe lines by a saw blade or a laser cutting device.

Figure 27:
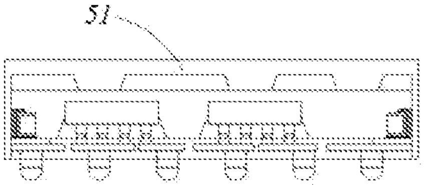

In S7, as shown in FIG. 27, a first shielding layer 51 is formed on an outside of the plastic packaging layer 4 of each of the individual packaging structures, and the first shielding layer 51 covers at least a side face of the plastic packaging layer 4.

The first shielding layer 51 is formed on the plastic packaging layer 4 by metal deposition processes, such as electroplating, sputtering, PVD and CVD, or conductive composite layer deposition processes, such as ultrasonic spraying and vacuum film bonding and pressing. The first shielding layer 51 may be made of sputtered sandwiched metal film materials of copper, stainless steel and titanium, such as stainless steel/copper/stainless steel and titanium/copper/titanium, or a conductive composite such as a conductive resin containing high-density metal fillers such as silver/copper, or a combination of at least two of the aforementioned materials as long as the material may play the role of shielding or absorbing electromagnetic waves.

When the second shielding layer 52 exists, the shielding-layer grooves or shielding-layer through-holes 53 are filled with the material of the first shielding layer 51.

In some other embodiments of the present invention, step S7 may also be performed before step S6.

In the present invention, there are a plurality of implementation modes for "disposing the electrical connector 3 on the first face of the redistribution layer 1", and a number of fabricating procedures will be specifically described below.

Figure 28:
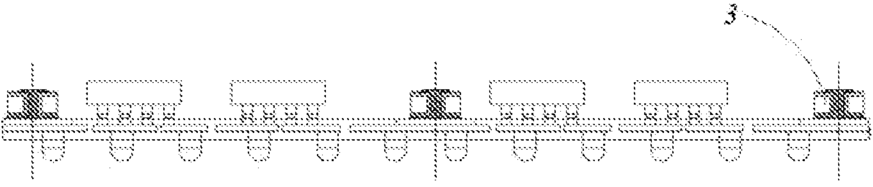
FIG. 28 to FIG. 35 are schematic diagrams of various steps of disposing electrical connectors in a manufacturing method of a fan-out packaging structure according to the present invention.
Figure 29:
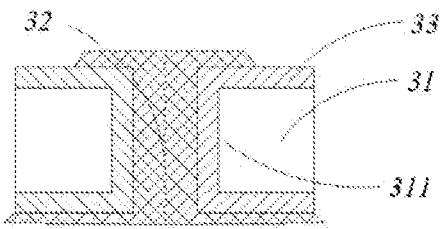

Procedure I:

In S**2*a*1, as shown in FIGS. 28 and 29, a first through-hole 311 penetrating through upper and lower surfaces of a body member 31 is fabricated in the body member 31; the first through-hole 311 is filled with a conductive filler 32; and the conductive filler 32 is coated on a bottom face of the body member 31 to electrically connect the body member 31 to the grounding line layer 111 by means of the conductive filler 32; and the conductive filler 32** covers or spans at least a portion of the scribe lines.

The body member 31 is made of a synthetic resin and other polymer materials, or silicon, ceramics and other low-cost basic materials with certain structural strength, so as to provide structural support for the electrical connector 3.

The first through-hole 311 is formed in the body member 31 by laser drilling, mechanical drilling, or deep reactive ion etching.

In some embodiments of the present invention, a first metal layer or first metal layers 33 is/are formed on one or more of the upper and lower surfaces of the body member 31 and the sidewall face of the first through-hole 311 by means of metal deposition processes such as electroplating, sputtering, PVD, CVD, and tamping. The first metal layer 33 may be a single layer formed from copper, silver, tin, nickel and other suitable conductive materials, or a composite layer formed from a variety of materials.

In some embodiments of the present invention, the surface of the body member 31 covered with no first metal layer 33 is provided with a green oil material layer 34.

The first through-hole 311 is filled with a conductive filler 32, which is conductive filling material such as a conductive adhesive or a metal solder. The conductive filler 32 may be fully filled in the first through-hole 311 and partially cover the first metal layer 33 covered on the upper surface of the body member 31.

In some other embodiments of the present invention, the conductive filler 32 may also be partially filled in the first through-hole 311.

The bottom of the body member 31 is cladded with the conductive filler 32, and is electrically connected to the grounding line layer 111 by means of the conductive filler 32.

Figure 30:
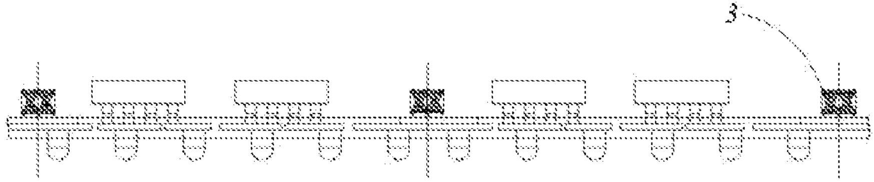
Figure 31:
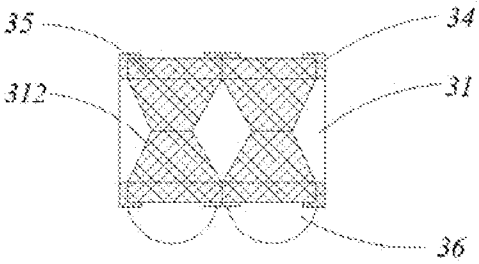

Procedure II:

In S2*b*1, as shown in FIGS. 30 and 31, a second through-hole 312 penetrating through the upper and lower surfaces of the body member 31 is fabricated in the body member 31; the second through-hole 312 is filled with metal, or the inner wall face of the second through-hole 312 is covered with metal; and the upper and lower surfaces of the body member 31 are plated with a second metal layer 35.

A second electrical contact block 36 is disposed on the second metal layer 35 on the lower surface of the body member 31.

The electrical connector 3 is bonded on the grounding line layer 111 by means of the second electrical contact block 36, and the second metal layer 35 covers or spans the scribe line.

Figure 32:
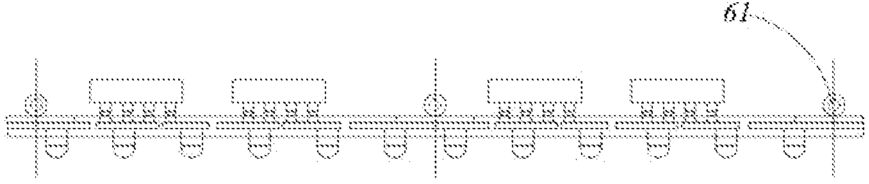

Procedure III:

In S2*c*1, as shown in FIG. 32, one or a combinational structure of a metal bump, a tin ball, and a copper core ball 61 is electrically connected to the grounding line layer 111 and covers the scribe lines.

Figure 33:
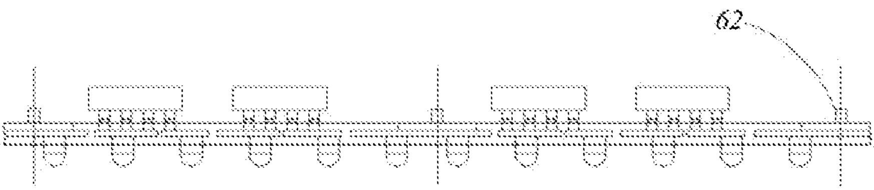

Procedure IV:

In S2*d*1, as shown in FIG. 33, copper bumps 62 are electroplated on the grounding line layer 111, and the copper bumps 62 cover or span at least a portion of the scribe lines.

Figure 34:
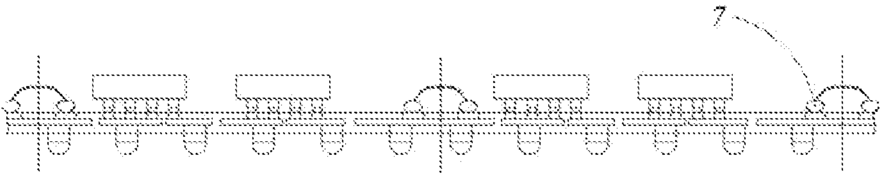

Procedure V:

In S2*e*1, as shown in FIG. 34, the grounding line layers 111 on both sides of the scribe lines are bonded and connected by means of conventional metal soldering wires 7.

Figure 35:
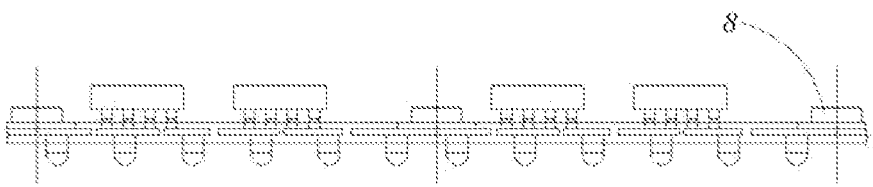

Procedure VI:

In S2*f*1, as shown in FIG. 35, metal paste 8 is applied to the grounding line layer 111 and covers or spans at least a portion of the scribe lines.

In summary, according to the present invention, the first shielding layer is connected to the grounding line layer by means of the electrical connector, such that the electrical connector may have relatively large-area surface contact with the first shielding layer and the grounding line layer, respectively, thereby reducing the resistance among the electrical connector, the first shielding layer and the grounding line layer to improve the shielding effect of the first shielding layer. Thus, higher resistance occurring due to direct connection of the first shielding layer to the thin metal line layer on the side face is avoided. Meanwhile, the electrical connector in the present invention is made of a conventional low-cost material, has a simple manufacturing process, and is easy to realize and thus applicable to large-scale industrial manufacturing procedures.

It should be understood that although the present invention is described in terms of embodiments in this description, not every embodiment includes only one independent technical solution. The statement mode of the description is merely for clarity, and those skilled in the art should regard the description as a whole. The technical solutions in various embodiments may also be combined properly to develop other embodiments understandable by those skilled in the art.

A series of detailed descriptions listed above are merely for specifically illustrating the feasible embodiments of the present invention, but not intended to limit the protection scope of the present invention. Any equivalent embodiments or variations made without departing from the technical spirit of the present invention shall fall within the protection scope of the present invention.

What is claimed is:

1. A fan-out packaging structure, comprising a redistribution layer and at least one chip or chip-bearing package disposed on a first face of the redistribution layer, wherein:

the redistribution layer comprises a grounding line layer;

the fan-out packaging structure further comprises at least one plastic packaging layer, at least one first shielding layer and at least one electrical connector, the electrical connector being disposed on the first face of the redistribution layer, located on an outside of the chip or chip-bearing package, and electrically connected to the grounding line layer;

the plastic packaging layer is disposed at least on the first face of the redistribution layer to encapsulate the electrical connector and the chip or chip-bearing package;

the first shielding layer at least partially covers a side surface of the plastic packaging layer; and the electrical connector is at least partially exposed to the side surface of the plastic packaging layer and electrically connected to the first shielding layer, and the first shielding layer and the grounding line layer are electrically conductive to each other by means of the electrical connector;

the electrical connector comprises a body member, and the body member is made of an organic polymer resin with an inorganic filler, or an organic polymer resin with a glass fiber cloth and a filler sheet;

a first through-hole penetrating through upper and lower surfaces of the body member is disposed in a side of the body member facing a sidewall of the first shielding layer adjacent to the body member; and the first through-hole is filled with a conductive filler, a bottom of the body member is cladded with the conductive filler and is electrically connected to the grounding line layer, and side faces of the conductive filler are exposed from the plastic packaging layer and electrically connected to the first shielding layer, the conductive filler is a conductive adhesive comprising silver and/or copper, or a metal solder, a first metal layer or first metal layers is/are disposed on one or more of the upper and lower surfaces of the body member and a sidewall face of the first through-hole.

2. The fan-out packaging structure according to claim 1, wherein the redistribution layer comprises a patterned metal line layer and a patterned dielectric layer, and the metal line layer at least partially forms the grounding line layer.

3. The fan-out packaging structure according to claim 2, wherein the metal line layer has a thickness of less than 10 μm and a minimum line spacing of less than 15 μm, a first electrical contact block is disposed on a second face opposite to the first face of the redistribution layer, and the first electrical contact block is electrically connected to the metal line layer, the dielectric layer is made of one or a combination of an organic polymer resin, an organic polymer resin with an inorganic filler, an organic polymer resin with a glass fiber cloth and a filler sheet, and polyimide, and the metal line layer is made of one or a combination of copper, titanium, and titanium tungsten.

4. The fan-out packaging structure according to claim 1, wherein a second shielding layer is further disposed between the first shielding layer and the plastic packaging layer, the second shielding layer being a single-layer shielding layer or a multi-layer composite shielding layer, and the second shielding layer having a different shielding coefficient from that of the first shielding layer in at least a portion of frequency range.

5. The fan-out packaging structure according to claim 4, wherein the second shielding layer is internally provided with a plurality of shielding-layer grooves or shielding-layer through-holes, the first shielding layer is filled in the shielding-layer grooves or the shielding-layer through-holes, or the first shielding layer is plated on inner wall faces of the shielding-layer grooves or the shielding-layer through-holes.

6. The fan-out packaging structure according to claim 1, wherein the electrical connector is located at each of four corners and/or on each of four edges of the redistribution layer and is distributed in a substantially symmetrical manner with respect to a center of the redistribution layer.

7. A manufacturing method of a fan-out packaging structure according to claim 1, comprising the steps of:

providing a carrier board, fabricating a patterned metal line layer and a patterned dielectric layer on the carrier board, stacking the patterned metal line layer and the patterned dielectric layer to form a redistribution layer, and forming a grounding line layer from at least a portion of the metal line layer close to or covering or spanning at least a portion of scribe lines;

disposing a chip, and/or a chip-bearing package, and/or a passive device on a first face of the redistribution layer and electrically connecting the chip, and/or the chip-bearing package, and/or the passive device to the metal line layer;

disposing an electrical connector on the first face of the redistribution layer to cover or span at least a portion of the scribe lines, and electrically connecting the electrical connector to the grounding line layer;

plastic-packaging the chip and the electrical connector to form a plastic packaging layer;

removing the carrier board to form a first electrical contact block on a second face opposite to the first face of the redistribution layer;

cutting a complete package along the scribe lines to form individual packaging structures; and forming a first shielding layer on an outside of the plastic packaging layer of each of the individual packaging structures, the first shielding layer covering at least a side face of the plastic packaging layer.

8. The manufacturing method of the fan-out packaging structure according to claim 7, wherein the metal line layer has a thickness of less than 10 μm and a minimum line spacing of less than 15 μm, the dielectric layer is made of one or a combination of an organic polymer resin, an organic polymer resin with an inorganic filler, an organic polymer resin with a glass fiber cloth and a filler sheet, and polyimide, and the metal line layer is made of one or a combination of copper, titanium, and titanium tungsten.

9. The manufacturing method of the fan-out packaging structure according to claim 7, wherein disposing the electrical connector on the first face of the redistribution layer specifically comprises:

fabricating, in a body member, a first through-hole penetrating through upper and lower surfaces of the body member, filling the first through-hole with a conductive filler and coating a bottom face of the body member with the conductive filler to electrically connect the body member to the grounding line layer by means of the conductive filler, the first through-hole covering or spanning at least a portion of scribe lines.

10. The manufacturing method of the fan-out packaging structure according to claim 7, wherein before fabricating the first shielding layer, the method further comprises the steps of:

fabricating one or more shielding layers on the plastic packaging layer to form a second shielding layer;

fabricating a plurality of shielding-layer grooves or shielding-layer through-holes in the second shielding layer; and filling or plating the shielding-layer grooves or shielding-layer through-holes with a material of the first shielding layer, the second shielding layer has a different shielding coefficient from that of the first shielding layer in at least a portion of frequency range.

* * * * *